United States Patent
Kase et al.

(10) Patent No.: US 8,102,115 B2
(45) Date of Patent: Jan. 24, 2012

(54) ORGANIC EL DISPLAY DEVICE AND MANUFACTURING METHOD THEREOF

(75) Inventors: Satoru Kase, Mobara (JP); Yoshinori Ishii, Chiba (JP); Eiji Matsuzaki, Yokohama (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 187 days.

(21) Appl. No.: 12/554,163

(22) Filed: Sep. 4, 2009

(65) Prior Publication Data

US 2010/0060158 A1      Mar. 11, 2010

(30) Foreign Application Priority Data

Sep. 8, 2008  (JP) ................. 2008-229640

(51) Int. Cl.
*H01J 1/62* (2006.01)
(52) U.S. Cl. ...................... 313/504; 313/512
(58) Field of Classification Search .................. 313/498, 313/504, 506, 512

See application file for complete search history.

(56) References Cited

U.S. PATENT DOCUMENTS

| 7,265,805 B2 | 9/2007 | Jung | |
|---|---|---|---|
| 2007/0013292 A1 * | 1/2007 | Inoue et al. | 313/504 |

FOREIGN PATENT DOCUMENTS

JP       2005-165264      6/2005

* cited by examiner

*Primary Examiner* — Vip Patel
(74) *Attorney, Agent, or Firm* — Antonelli, Terry, Stout & Kraus, LLP.

(57) ABSTRACT

An organic EL display panel which does not impair a sealing effect and ensures a smooth edge portion when individual organic EL display panels are separated from a mother panel on which a plurality of organic EL display panels are formed is provided. A mother panel is formed by adhering a mother element substrate and a mother sealing substrate by way of an adhesive material sheet. In separating the mother panel into individual organic EL display panels, laser beams are radiated to the mother panel along separation lines so as to lower an adhesive strength of the adhesive material sheet at such portions. Thereafter, scribing is applied to the mother panel along the separation lines. Due to such a constitution, it is possible to realize an organic EL display panel without lowering a sealing effect and ensuring smooth appearance.

7 Claims, 6 Drawing Sheets

FIG. 3A1
FIG. 3A2
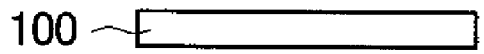
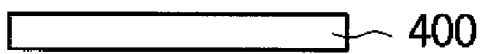
FIG. 3B1
FIG. 3B2
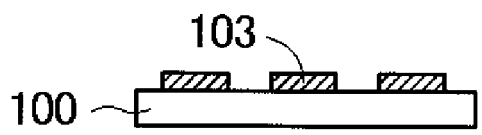
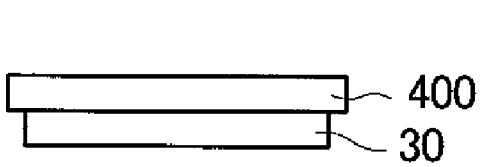
FIG. 3C
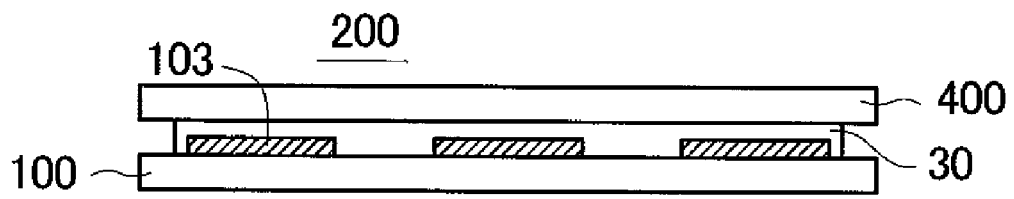
FIG. 3D
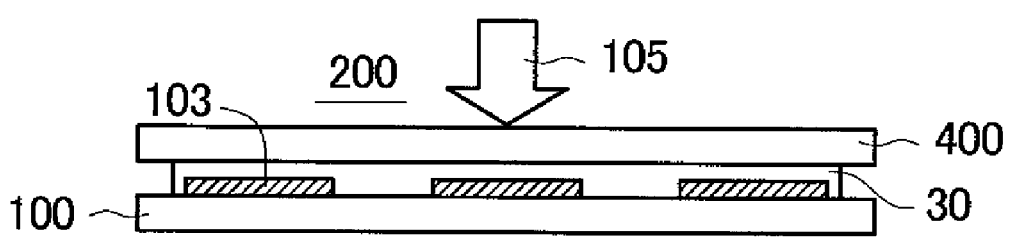
FIG. 3E
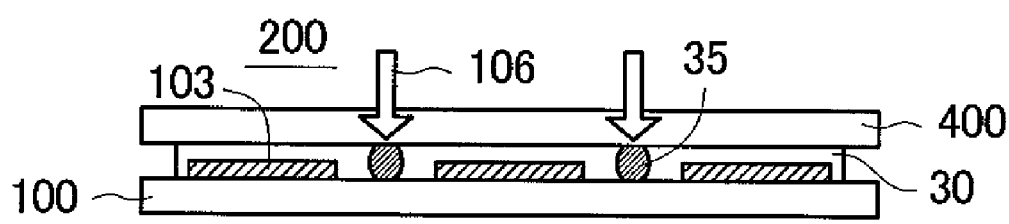

ORGANIC EL DISPLAY DEVICE AND MANUFACTURING METHOD THEREOF

CROSS-REFERENCE TO RELATED APPLICATIONS

The present application claims priority from Japanese Application JP 2008-229640 filed on Sep. 8, 2008, the content of which is hereby incorporated by reference into this application.

BACKGROUND OF THE INVENTION

1. Field of the Invention

The present invention relates to an organic EL display device, and more particularly to a highly reliable manufacturing method of an organic EL display device which suppresses the generation of dark spots or the like attributed to moisture.

2. Background Art

In an organic EL display device, an organic EL layer is sandwiched between a lower electrode and an upper electrode, a fixed voltage is applied to the upper electrode, and emission of light from the organic EL layer is controlled by applying a data signal voltage to the lower electrode thus forming an image. The data signal voltage is supplied to the lower electrode via a thin film transistor (TFT). An organic EL display device is classified into a bottom-emission-type organic EL display device in which light emitted from organic EL layers is taken out in the direction of a glass substrate on which the organic EL layers and the like are formed and a top-emission-type organic EL display device in which light emitted from organic EL layers is taken out in the direction opposite to a glass substrate on which the organic EL layers and the like are formed.

When moisture is present in an organic EL material used in an organic EL display device, the light emission characteristic is deteriorated and hence, when the organic EL display device is operated for a long time, portions of the organic EL material which are deteriorated with moisture do not emit light. These portions appear as dark spots on a display region. The dark spots grow with time and become a defect of an image. A phenomenon referred to as an edge growth in which a region where light is not emitted is increased around a pixel also occurs due to moisture.

To prevent the generation or the growth of the dark spots or the like, it is necessary to prevent the intrusion of moisture into the inside of the organic EL display device or to remove the intruded moisture from the organic EL display device. Accordingly, an element substrate on which organic EL layers are formed is sealed by a sealing substrate by way of a sealing member formed on a periphery of the element substrate thus preventing the intrusion of moisture into the inside of the organic EL display device from the outside. A sealed inner space of the organic EL display device is filled with an inert gas such as $N_2$. On the other hand, to remove moisture intruded into the inside of the organic EL display device, a desiccant is arranged in the inside of the organic EL display device. This organic EL display device is referred to as a hollow-sealing-type organic EL display device.

The hollow-sealing-type organic EL display device has drawbacks such as difficulty in adjusting a gap between the element substrate and the sealing substrate, difficulty in adjusting pressure in the sealed inside, contamination of the organic EL material by a gas discharged from a sealing agent at the time of performing the sealing operation using a sealing agent or a low throughput. Further, there also exists a drawback that when the sealing substrate is pushed from the outside after completion of the organic EL display panel, the sealing substrate and the organic EL layer formed on the element substrate are brought into contact with each other so that the organic EL layer is broken.

To cope with such drawbacks attributed to the hollow sealing structure, there has been known a technique in which a resin sheet having a fixed film thickness is sandwiched between an element substrate and a sealing substrate thus protecting an organic EL material from moisture using such a resin sheet. This technique is referred to as solid sealing. In the solid sealing, a resin sheet is firstly adhered to the sealing substrate, and the sealing substrate to which the resin sheet is adhered and the element substrate are adhered to each other by way of the resin sheet.

The manufacture of an organic EL display panel for every individual panel is inefficient. Accordingly, there has been adopted a method in which a large mother panel on which a plurality of large-sized organic EL display panels are formed is formed, and the mother panel is separated into the individual organic EL display panels. The same goes for a liquid crystal display device. That is, there has been adopted a method in which a large mother panel on which a plurality of liquid crystal display panels are formed is manufactured, and the mother panel is separated into individual liquid crystal display panels.

With respect to the liquid crystal display device, there may be a case where a periphery of the mother panel on which respective individual liquid crystal display panels are formed is surrounded by a sealing material. This is because even when a thickness of the liquid crystal display panel is decreased due to polishing of an outer side of the mother panel, the sealing material can prevent the impregnation of a polishing liquid into the inside of the mother panel.

In this case, to separate the mother panel into the individual liquid crystal display panels, it is necessary to cut the mother panel such that cutting lines traverse the sealing material which surrounds the periphery of the mother glass on which respective individual liquid crystal display panels are formed. This cutting is performed by scribing using a diamond cutting wheel. Here, a stress generated in glass differs between a portion where the sealing material is formed and a portion which is made of only glass and hence, cross sections obtained by scribing become irregular. To prevent such irregularities in cross section, JP-A-2005-165264 (patent document 1) describes the constitution which removes the sealing material at a portion where scribes traverse the sealing material by laser beam radiation.

SUMMARY OF THE INVENTION

In the manufacture of a solid-sealing-type organic EL display devices, to form a large number of organic EL display panels from a mother panel simultaneously, it is necessary to cut a mother element substrate, a mother sealing substrate and an adhesive material sheet sandwiched between the mother element substrate and the mother sealing substrate. Although the mother element substrate and the mother sealing substrate are made of glass, the adhesive material sheet is made of a resin and hence, there arises a drawback when the mother panel is separated into individual organic EL display panels.

FIG. 5 shows a drawback which a conventional solid-sealing-type organic EL display panel possesses. FIG. 5A is a cross-sectional view showing a state of a mother panel 200 where a mother element substrate 100 is sealed by a mother sealing substrate 400 by way of an adhesive material sheet 30. In FIG. 5A, organic EL elements 103 are formed on the mother element substrate 100, and the mother panel 200 is separated into portions corresponding to the individual organic EL elements 300. In this specification, the term "organic EL element 103" generally implies a part which forms an image in the organic EL panel 300 including organic EL layers, drive TFTs and the like.

FIG. 5B is a schematic cross-sectional view showing a state where scribing is performed for separating the mother panel 200 into the individual organic EL display panels 300. In FIG. 5B, an arrow 107 indicates the scribing. A dotted line extending from the arrow 107 indicates a breaking line. When scribing is applied only to glass, the breaking line extends linearly as indicated by the dotted line. However, when the adhesive material sheet 30 which is made of a resin is present between glasses, a broken surface of glass by scribing becomes irregular at such a portion.

FIG. 5C is a cross-sectional view of the organic EL display panel 300 showing a state where the mother panel 200 is separated into the individual organic EL display panels 300 in such a state. Each individual organic EL display panel 300 exhibits a serrated edge portion because of irregular breaking of the organic EL display panel 300 by scribing.

FIG. 5D is a cross-sectional view showing each separated organic EL display panel 300. When the edge portion is serrated as shown in FIG. 5D, the adhesion between the glass substrates 10, 40 and the adhesive material sheet 30 at the edge portion becomes weak and hence, the edge portion becomes a starting point where the adhesive material sheet 30 and the glass substrates 10, 40 are peeled off from each other. When such peeling-off occurs, moisture is liable to intrude into the organic EL element 103 thus deteriorating a lifetime of the organic EL display device.

In FIG. 5, the adhesive material sheet 30 is formed over the whole surface of the mother panel and hence, a strain of glass is constant. The solid-sealing-type organic EL display device shown in FIGS. 5A to 5D differs from the hollow-sealing-type organic EL display device described in patent document 1 with respect to this point. That is, in patent document 1, most of portions where scribing is made are made of only glass. Accordingly, when the scribe traverses a portion where the sealing material is formed, there arises a drawback that cracks are irregularly generated in the glass substrate due to the difference in stress generated in glass between the portion where the sealing material is formed and other portions.

On the other hand, in the mother panel 200 for manufacturing the solid-sealing-type organic EL display panel which is an object to which the invention is applied, although the stress in glass is constant, the adhesive material sheet 30 is not broken in scribing thus giving rise to a drawback that a glass edge surface becomes irregular. Accordingly, the technique disclosed in patent document 1 and the invention differs from each other with respect to phenomena from which the technique described in patent document 1 and the invention are derived respectively.

Accordingly, it is an object of the invention to maintain a regular shape of an edge surface of a glass substrate by easily breaking the adhesive material sheet 30 on the edge surface of the individual organic EL display panel 300 when the mother panel 200 is separated into the individual organic EL display panels 300 thus preventing lowering of reliability attributed to the irregular shape of the edge portion.

The invention has been made to overcome the above-mentioned drawbacks, and specific means of the invention are as follows.

(1) According to one aspect of the invention, there is provided an organic EL display device having an organic EL display panel in which an element substrate on which organic EL elements are formed and a sealing substrate are adhered to each other by way of an adhesive material sheet, wherein a portion of the adhesive material sheet at an edge surface of the organic EL display panel is degenerated differently from other portions of the adhesive material sheet.

(2) The organic EL display device having the above-mentioned constitution (1) is characterized in that a depth of the portion of the adhesive material sheet which is degenerated is not less than 0.05 mm from an edge portion of the element substrate or the sealing substrate.

(3) The organic EL display device having the above-mentioned constitution (1) is characterized in that the portion of the adhesive material sheet which is degenerated is carbonized differently from said other portions of the adhesive material sheet.

(4) According to another aspect of the invention, there is provided an organic EL display device having an organic EL display panel where an element substrate on which organic EL elements are formed and a sealing substrate are adhered to each other by way of an adhesive material which covers the organic EL elements, wherein a portion of the adhesive material at an edge surface of the organic EL display panel is degenerated differently from other portions of the adhesive material.

(5) The organic EL display device having the above-mentioned constitution (4) is characterized in that a depth of the portion of the adhesive material which is degenerated is not less than 0.05 mm from an edge portion of the element substrate or the sealing substrate.

(6) The organic EL display device having the above-mentioned constitution (4) is characterized in that the portion of the adhesive material which is degenerated is carbonized differently from said other portions of the adhesive material.

(7) The organic EL display device having the above-mentioned constitution (4) is characterized in that the adhesive material is formed by printing.

(8) According to still another object of the invention, there is provided a method of manufacturing organic EL display devices which are formed by separating a mother panel where a mother element substrate on which a plurality of element substrates are formed and a mother substrate sealing material are adhered to each other by way of an adhesive material sheet into individual liquid crystal display panels, wherein laser beams are radiated to separation lines by which the mother panel is separated into the individual liquid crystal display panels so as to lower an adhesive strength of the adhesive material sheet in the vicinity of the separation line and, thereafter, scribing is applied to the mother panel along the separation lines so as to separate the mother panel into the individual organic EL display panels.

(9) According to a further object of the invention, there is provided a method of manufacturing organic EL display devices which are formed by separating a mother panel where a mother element substrate on which a plurality of element substrates are formed and a mother substrate sealing material are adhered to each other by way of an adhesive material which covers the whole surface of the plurality of element substrates into individual liquid crystal display panels, wherein laser beams are radiated to separation lines by which the mother panel is separated into the individual liquid crystal display panels so as to lower an adhesive strength of the adhesive material in the vicinity of the separation line and, thereafter, scribing is applied to the mother panel along the separation lines so as to separate the mother panel into the individual organic EL display panels.

In separating the mother panel which is formed by adhering the mother element substrate on which the plurality of element substrates are formed and the mother sealing substrate to each other by way of the adhesive material sheet which functions as a sealing material into the individual organic EL display panels, an adhesive strength of portions of the adhesive material sheet in the vicinity of separation lines can be decreased due to the radiation of laser beams along the separation lines. Accordingly, when scribing is applied to the mother panel along the separation lines, a shape of glass at cut portions becomes regular thus preventing the edge surface from becoming a starting point of peeling-off of the glass substrate and the adhesive material sheet. Further, the appearance of the organic EL display device can be also enhanced.

Also in a case where an adhesive material which covers the display region is formed by printing in place of the adhesive material sheet in a mother sealing panel state, in the same manner as the above-mentioned case, due to the radiation of laser beams to the mother panel along the separation lines, a sealing effect of the liquid crystal display panel can be enhanced and, at the same time, the appearance of the liquid crystal display panel can be improved.

BRIEF DESCRIPTION OF THE DRAWINGS

FIG. 3A1 to FIG. 3H are views showing manufacturing steps of the organic EL display device of the invention;

DESCRIPTION OF THE PREFERRED EMBODIMENTS

Before explaining an embodiment of the invention specifically, the constitution of an organic EL display device to which the invention is applied is explained.

Figure 1:
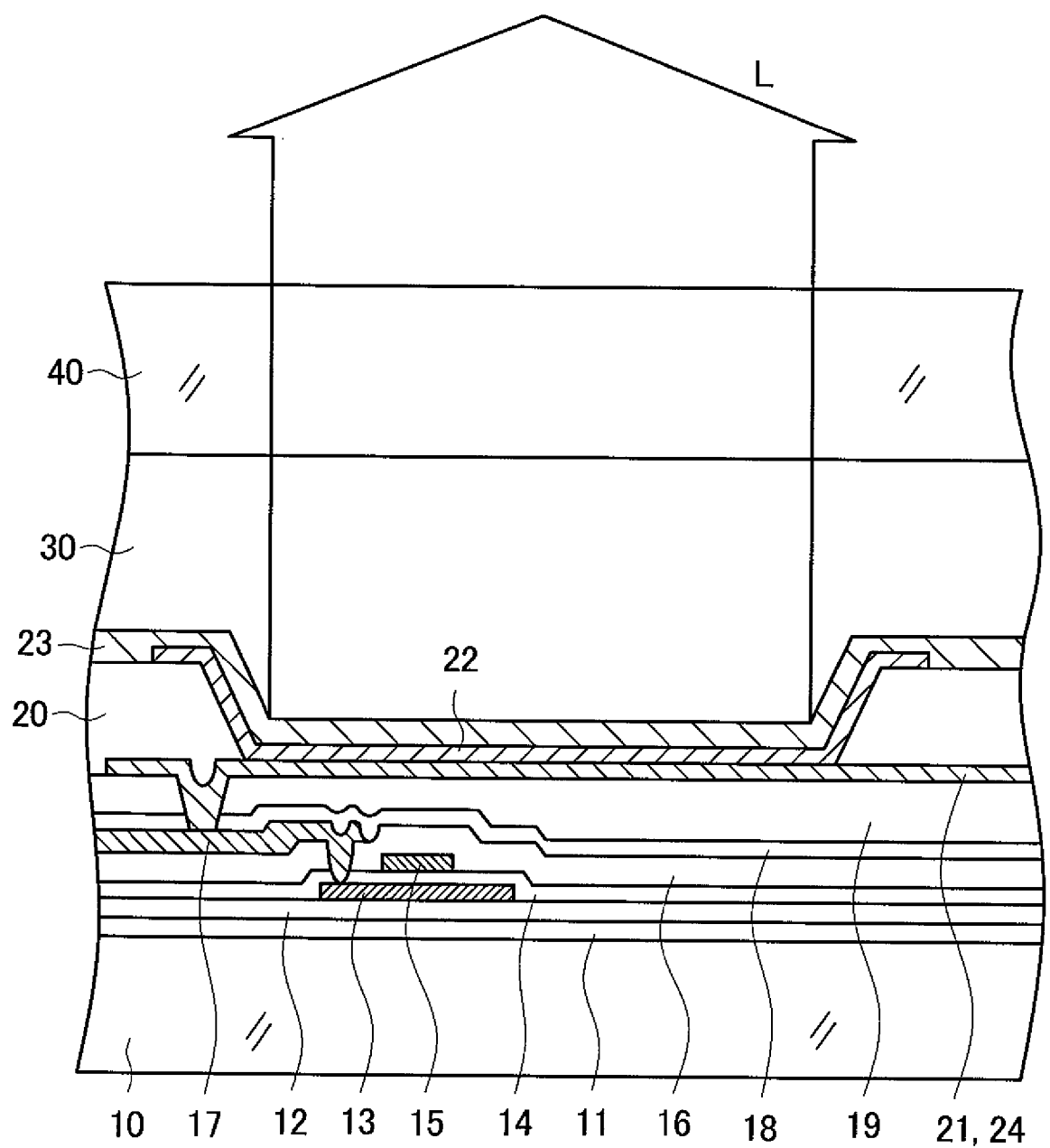
FIG. 1 is a cross-sectional view of a display region of an organic EL display panel.

FIG. 1 is a cross-sectional view of a display region of a top-emission-type organic EL display device to which the invention is applied. Although this embodiment is explained by taking the top-emission-type organic EL display device as an example, the invention is also applicable to a bottom-emission type organic EL display device in the same manner. The top-emission-type organic EL display device can be classified into a top-anode-type organic EL display device in which an anode is arranged above an organic EL layer and a top-cathode-type organic EL display device in which a cathode is arranged above an organic EL layer. Although FIG. 1 shows the top-anode type organic EL display device, the invention is also applicable to the top-cathode type organic EL display device in the same manner.

As shown in FIG. 1, a first background film 11 made of SiN and a second background film 12 made of $SiO_2$ are formed on an element substrate 10. These background films 11, 12 are provided for preventing impurities from a glass substrate from contaminating a semiconductor layer 13. The semiconductor layer 13 is formed on the second background film 12. In forming the semiconductor layer 13, an a-Si film is firstly formed by a CVD method and, thereafter, the a-Si film is formed into a poly-Si film by radiating laser beams to the a-Si film.

A gate insulation film 14 made of $SiO_2$ is formed so as to cover the semiconductor layer 13. A gate electrode 15 is formed in a state where the gate electrode 15 faces the semiconductor layer 13 in an opposed manner with the gate insulation film 14 sandwiched therebetween. Using the gate electrode 15 as a mask, the semiconductor layer 13 is doped with impurities such as phosphorus or boron by ion implantation so as to make the semiconductor layer 13 conductive thus forming a source portion or a drain portion in the semiconductor layer 13.

An interlayer insulation film 16 made of $SiO_2$ is formed so as to cover the gate electrode 15. The interlayer insulation film 16 is provided for ensuring the insulation between gate lines and drain lines 17. The drain line 17 is formed on the interlayer insulation film 16. The drain line 17 is connected with the drain of the semiconductor layer 13 via a through hole formed in the interlayer insulation film 16 and the gate insulation film 14.

Thereafter, to protect a thin film transistor (TFT) formed in the above-mentioned manner, an inorganic passivation film 18 made of SiN is formed on the interlayer insulation film 16 by coating. An organic passivation film 19 is formed on the inorganic passivation film 18. The organic passivation film 19 plays a role of protecting the TFT more completely together with the inorganic passivation film 18. The organic passivation film 19 also plays a role of leveling a surface on which an organic EL layer 22 is formed. Accordingly, the organic passivation film 19 has a large thickness of 1 to 4 μm.

A reflection electrode 24 made of Al or Al alloy is formed on the organic passivation film 19. Since Al or Al alloy exhibits high reflectance, Al or Al alloy is preferably used as a material of the reflection electrode 24. The reflection electrode 24 is connected with the drain line 17 via a through hole formed in the organic passivation film 19 and the inorganic passivation film 18.

This embodiment provides the top-anode-type organic EL display device and hence, a lower electrode 21 of the organic EL layer 22 constitutes a cathode. Accordingly, the Al layer or the Al alloy layer which is used for forming the reflection electrode 24 is also used for forming the lower electrode 21 of the organic EL layer 22. This is because Al or Al alloy has a relatively small work function and hence, Al or Al alloy can function as a cathode.

The organic EL layer 22 is formed on the lower electrode 21. The organic EL layer 22 is constituted of an electron transport layer, a light emission layer and a hole transport layer which are laminated from below. Here, an electron injection layer may be interposed between the electron transport layer and the lower electrode 21. Further, a hole injection layer may be interposed between the hole transport layer and an upper electrode 23. The upper electrode 23 which constitutes an anode is formed on the organic EL layer 22. In this embodiment, the upper electrode 23 is made of InZnO. The InZnO film is formed over the whole display region by vapor deposition without using a mask. A thickness of the InZnO film is set to approximately 30 nm for maintaining optical transmissivity. An ITO film may be used in place of the InZnO film.

A material which can be used as an electron-transport-layer material is not specifically limited provided that the material exhibits electron transport property and can be easily formed into a charge-transfer complex by co-deposition with alkali metal and, for example, a metal complex such as tris (8-quinolinolato)aluminum, tris(4-methyl-8-quinolinolato) aluminum, bis(2-methyl-8-quinolinolato)-4-phenylphenolato-aluminum, bis[2-[2-hydroxyphenyl]benzooxazolato] zinc, 2-(4-biphenylyl)-5-(4-tert-butylphenyl)-1,3,4-oxadiazol, 1,3-bis[5-(p-tert-butylphenyl)-1,3,4-oxadiazol-2-yl]benzene or the like can be used as the electron-transport-layer material.

A material which can be used as a light-emitting-layer material is not specifically limited provided that the material is made of a host material which has an electron-and-hole transporting ability, and a dopant which is added to the host material, emits a fluorescent light or a phosphorous light by re-coupling with the host material and forms a light emitting layer by co-vapor-deposition. For example, as the host material, a complex such as tris(8-quinolinolato)aluminum, bis(8-quinolinolato)magnesium, bis(benzo{f}-8-quinolinolato) zinc, bis(2-methyl-8-quinolinolato)aluminum oxide, tris(8-quinolinolato)indium, tris(5-methyl-8-quinolinolato) aluminum, 8-quinolinolato lithium, tris(5-chloro-8-quinolinolato)gallium, bis(5-chloro-8-quinolinolato) calcium, 5,7-dichloro-8-quinolinolato aluminum, tris(5,7-dibromo-8-hydroxyquinolinolato)aluminum, and poly[zinc (II)-bis(8-hydroxy-5-quinolinyl)methane], an anthracene derivative, a carbazole derivative or the like can be used.

Further, the dopant is a material which captures electrons and holes in a host material and emits light by re-coupling. For example, the red dopant may be formed of a pyran derivative, the green dopant may be formed of a coumarin derivative, and the blue dopant may be formed of a substance which emits fluorescent light such as an anthracene derivative or a substance which emits phosphorescence such as an iridium complex and a pyridinato derivative.

The hole transport layer may be made of a tetraaryl benzidine compound (triphenyl diamine: TPD), aromatic tertiary amine, a hydrazone derivative, carbazole derivative, a triazole derivative, an imidazole derivative, an oxadiazole derivative having an amino group, a polythiophene derivative, a copper phthalocyanine derivative or the like, for example.

Here, to prevent the organic EL layer 22 from being broken at an end portion thereof due to a broken step, a bank 20 is formed between the pixels. The bank 20 may be formed of an organic material, or the bank 20 may be formed of an inorganic material such as SiN. In forming the bank 20 using the organic material, in general, an acrylic resin is used.

An auxiliary electrode may be formed on the upper electrode 23 which is formed on the bank 20 for assisting the electrical conduction of the upper electrode 23. This is because when the resistance of the upper electrode 23 is large, brightness irregularities may occur. Although the auxiliary electrode is not used in this embodiment, it is needless to say that the invention is also applicable to an organic EL display device which uses the auxiliary electrode.

An adhesive material sheet 30 is formed on the upper electrode. The adhesive material sheet 30 is made of a thermosetting epoxy resin, and the adhesive material sheet 30 adheres the element substrate 10, specifically, the upper electrode 23 and the sealing substrate 40 made of glass to each other. A thickness of the adhesive material sheet 30 is set to 10 µm to 20 µm. The sealing substrate 40 is adhered to the adhesive material sheet 30, and the organic EL layer is protected from moisture by the sealing substrate 40.

Hereinafter, the invention is explained in detail in conjunction with embodiments.

Embodiment 1

Figure 2:
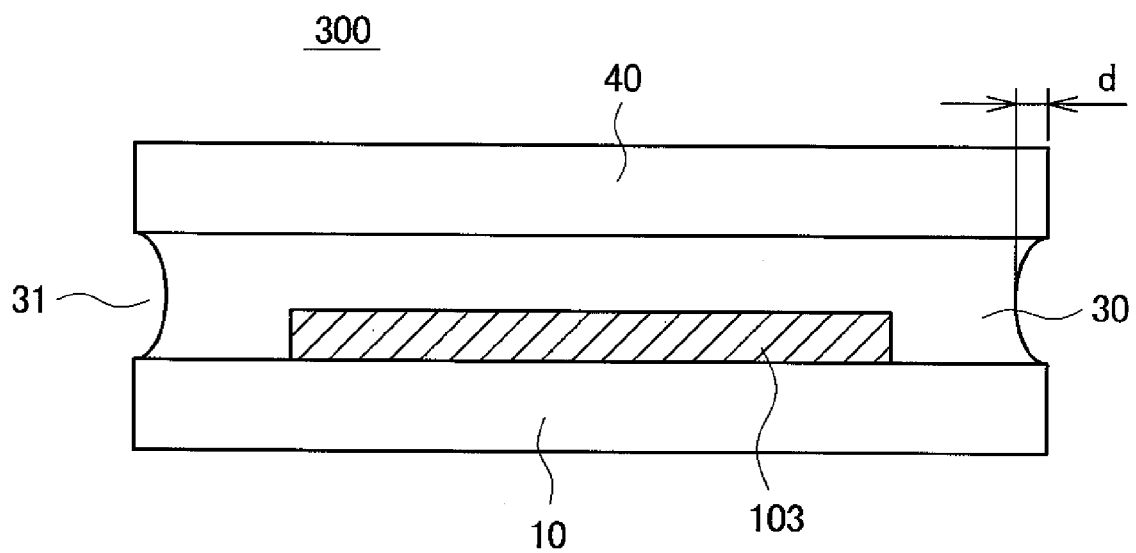
FIG. 2 is a cross-sectional view of an organic EL display device of the invention.

FIG. 2 is a cross-sectional view of an organic EL display panel 300 which constitutes the organic EL display device of the invention. In FIG. 2, organic EL elements for displaying an image are formed on the element substrate 10. The organic EL element is a general term including elements for forming an image such as the organic EL layers, TFTs and the like shown in FIG. 1.

The adhesive material sheet 30 which also performs a sealing function is formed on the element substrate 10 in a state where the adhesive material sheet 30 covers the organic EL elements. The sealing substrate 40 which is formed of a glass substrate is adhered to the element substrate 10 by the adhesive material sheet 30. The adhesive material sheet 30 is made of a thermosetting epoxy resin. A thickness of the adhesive material sheet 30 is set to 10 µm to 20 µm. Here, a material of the adhesive material sheet 30 is not limited to the epoxy resin, and the adhesive material sheet 30 may be made of an acrylic resin or a silicon resin.

Although the adhesive material sheet 30 is preferably formed of a moisture impermeable sheet, it is not always necessary for the adhesive material sheet 30 to possess a strong barrier property against moisture. This is because the sealing substrate 40 made of glass mainly functions as a barrier against moisture. That is, with the constitution of the organic EL display panel 300 shown in FIG. 2, the intrusion of moisture from above is blocked by the sealing substrate 40 made of glass, and it is necessary for moisture intruded from a side of the display panel to travel a long distance to arrive at the organic EL layer.

FIG. 2 shows the so-called solid sealing structure and hence, a space is not defined between the sealing substrate 40 and the element substrate 10. Accordingly, unlike the hollow sealed structure, a drawback that the sealing substrate 40 is brought into contact with the element substrate 10 when the sealing substrate 40 is pushed thus generating black points does not arise. Further, various drawbacks attributed to an internal pressure of a sealing gas during sealing also do not arise.

According to the invention, a plurality of organic EL display panels 300 each of which has the constitution shown in FIG. 2 are formed on a mother panel 200. The large-sized adhesive material sheet 30 for adhering a mother element substrate 100 and a mother sealing substrate 400 to each other is adhered to the mother sealing substrate 400 and, thereafter, the mother sealing substrate 400 and the mother element substrate 100 are adhered to each other. In this specification, both a large-sized so-called mother adhesive material sheet which is present in the mother panel and the adhesive material sheets each of which is present in each individual organic EL display panels are referred to as the adhesive material sheet 30.

The mother panel 200 formed in the above-mentioned manner is separated into the individual organic EL display panels 300 by scribing. When the adhesive material sheet 30 is present between the mother element substrate 100 and the mother sealing substrate 400, there arise drawbacks when the mother panel 200 is separated into the individual organic EL display panels 300. To cope with such drawbacks, according to the invention, laser beams are radiated to a scribing portion of the mother panel 200 between the individual organic EL display panels 300 so as to degenerate the adhesive material sheet 30 at such a scribing portion thus decreasing or eliminating an adhesive strength of the adhesive material sheet 30 at the scribing portion. Due to such a constitution, it is possible to prevent breaking of glass from being influenced by the adhesive material sheet 30.

In FIG. 2, an inwardly recessed portion 31 is formed on edge surfaces of the adhesive material sheet 30. This is because that, as explained later, laser beams are radiated to the scribing portion of glass so as to degenerate the adhesive material sheet 30 at such a portion thus facilitating peeling off of the adhesive material sheet 30 from glass. FIG. 2 shows a state in which portion 35 (see FIG. 3E, FIG. 3F and FIG. 3G) which are degenerated due to the radiation of laser beams from the adhesive material sheet 30 falls. In FIG. 2, a range "d" of the recessed portion 31 which is formed due to falling of the portion which is degenerated due to the radiation of laser beams becomes not less than 0.05 mm. The portions of the adhesive material sheet 30 which are degenerated due to the radiation of laser beams are easily peeled off from the glass substrate and hence, there is no possibility that peeling-off of portions of the adhesive material sheet 30 which are not degenerated from glass progresses using such degenerated portions as starting points.

FIG. 3 is a view showing steps of a manufacturing method according to the invention. FIG. 3A1 shows a mother element substrate 100. FIG. 3A2 shows the mother sealing substrate 400. FIG. 3B1 shows a state where organic EL elements 103 are formed on the mother element substrate 100. The organic EL element 103 is a general term for an image forming portion including one of pixels arranged in a matrix array and including an organic EL layer and a TFT. In FIG. 3A2, a plurality of organic EL elements 103 are formed on the mother element substrate.

FIG. 3B2 shows a state where the adhesive material sheet 30 is adhered to the mother sealing substrate 400. The adhesive material sheet 30 is formed of a large-sized epoxy sheet, and has a thermosetting property or an ultraviolet-ray curing property. FIG. 3B2 shows a state where the adhesive material sheet 30 is temporarily fixed to the mother sealing substrate 400. The adhesion of the adhesive material sheet 30 and the mother sealing substrate 400 is usually performed in a reduced-pressure atmosphere to prevent the entanglement of bubbles.

FIG. 3C shows a state where the mother element substrate 100 on which organic EL elements 103 are formed and the mother sealing substrate 400 to which the adhesive material sheet 30 is adhered are adhered to each other thus forming the mother panel 200. This adhesion is generally performed in a reduced-pressure atmosphere to prevent the entanglement of bubbles. The adhesion is performed by radiating ultraviolet-rays to the adhesive material sheet 30. An arrow 105 shown in FIG. 3C indicates ultraviolet-rays. The adhesion at this stage is temporary adhesion. Since the radiation of strong ultraviolet-rays ruptures the organic EL layer, the radiation of ultraviolet-rays is restricted to a level of temporary adhesion. Then, after returning the reduced-pressure atmosphere to the atmospheric pressure, the mother panel 200 is heated in a baking furnace so as to perform main curing of the adhesive material sheet 30.

To the mother panel 200 formed in such a manner, as shown in FIG. 3E, laser beams are radiated along scribing lines, that is, separation lines. An arrow 106 shown in FIG. 3E indicates laser beams. Portions of the adhesive material sheet 30 to which laser beams are radiated are degenerated by heat and lose an adhesive strength. When the intensity of laser beams is excessively strong, such portions of the adhesive material sheet 30 are evaporated, and the adhesion of the glass substrate and the adhesive material sheet 30 is adversely influenced by the pressure of bubbles. Accordingly, the intensity of laser beams is restricted to a level that the adhesive material sheet 30 is not evaporated. Green or red YAG laser beams are used as the laser beams.

The portions of the adhesive material sheet 30 to which the laser beams are radiated are degenerated by heat, and lose an adhesive strength thereof. The portions 35 which are degenerated are carbonized and appear in black. Although the portions 35 which are degenerated are indicated by an elliptical shape in FIG. 3E, FIG. 3E is a schematic view and the portions 35 often exhibit an irregular shape in the actual manufacture of an organic EL display device.

Figure 3F:
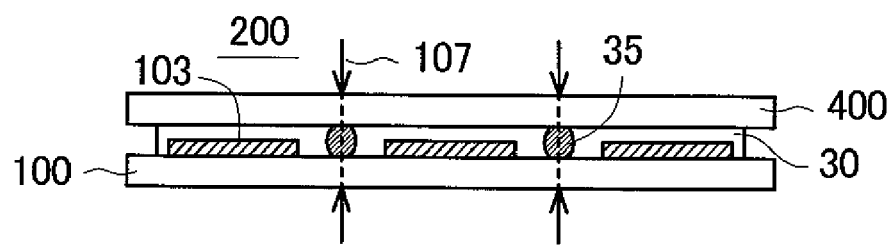

Thereafter, as shown in FIG. 3F, scribing is applied to the mother panel 200 along scribing lines using a diamond cutting wheel. Thereafter, when an impact is applied to the glass substrate, as shown in FIG. 3F, cracks are regularly generated in glass along dotted lines so that the mother panel 200 is separated into individual organic EL display panels 300.

Figure 3G:
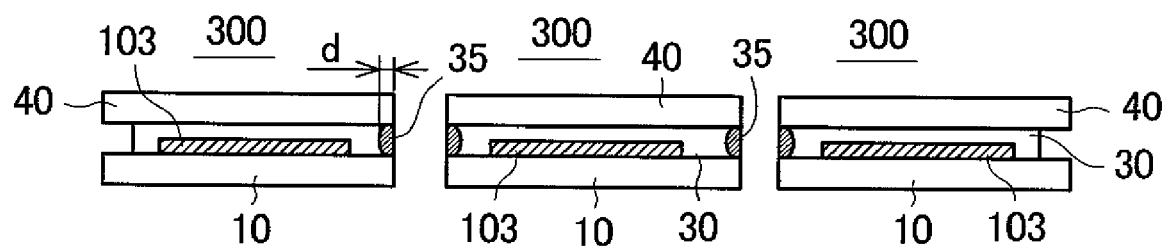

FIG. 3G is a cross-sectional view showing a state where the mother panel 200 is separated into the individual organic EL display panels 300. In separating the mother panel 200 into the individual organic EL display panels 300, laser beams are preliminarily radiated to the mother panel 200 along the scribing lines so as to lower or eliminate an adhesive strength of the adhesive material sheet 30 and hence, there is no possibility that cracks which are generated in glass are influenced by the adhesive material sheet 30. Further, the portions of the adhesive material sheet to which laser beams are radiated are degenerated so that such portions become fragile whereby it is possible to easily break the adhesive material sheet. Accordingly, a glass surface becomes as clean as a glass surface of an organic EL display device where a hollow space is defined between glass substrates. On the other hand, an area of the adhesive material sheet 30 in the vicinity of the scribe line is degenerated due to the radiation of laser beams and hence, portions of the adhesive material sheet 30 to which laser beams are radiated are decolored. In FIG. 3G, a depth "d" of the portions 35 which are degenerated due to the radiation of laser beams is set to not less than 0.05 mm.

Figure 3H:
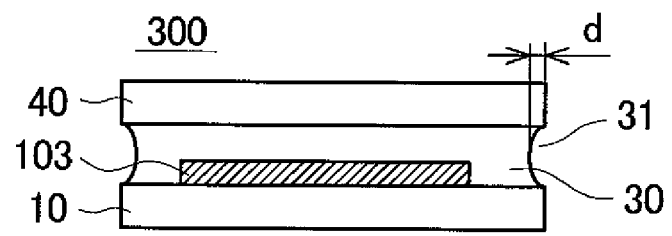

The portions of the adhesive material sheet 30 to which laser beams are radiated are degenerated differently from other portions of the adhesive material sheet 30 and hence, there may be a case where such portions are removed from the adhesive material sheet 30. FIG. 3H is a cross-sectional view of each individual liquid crystal display panel after separation. FIG. 3H shows a state in which the portions of the adhesive material sheet which are degenerated due to the radiation of laser beams are removed or fall so that edge portions of the adhesive material sheet 30 are inwardly recessed. The depth "d" of the recessed portion 31 in FIG. 3H is not less than 0.05 mm. However, the normal adhesion is ensured between the adhesive material sheet 30 and the element substrate 10 or between the adhesive material sheet 30 and the sealing substrate 40 at portions of the adhesive material sheet 30 to which laser beams are not radiated and hence, there is no possibility that the edge portions become starting points of peeling-off of the adhesive material sheet 30 from the element substrate 10 or the sealing substrate 40. As shown in FIG. 3H, according to the invention, edge surfaces of the element substrate 10 or the sealing substrate 40 are formed in a regular shape so that the organic EL display device also acquires an advantageous effect that the appearance of the liquid crystal display panel can be improved.

FIG. 4 is a detailed cross-sectional view of an edge portion of each individual organic EL display panel 300 formed in such a manner. FIG. 4A is a cross-sectional view of the edge portion of the organic EL display panel 300 in a state where the element substrate 10 on which the organic EL elements 103 are formed and the sealing substrate 40 are adhered to each other by way of the adhesive material sheet 30. In FIG. 4A, the inwardly recessed portion 31 having an elliptical shape is formed on the edge portion of the adhesive material sheet 30. This elliptical portion indicates that the adhesive material sheet 30 is degenerated due to the radiation of laser beams. However, it is not often the case that the adhesive material sheet 30 is degenerated in an elliptical shape.

Figure 4A:
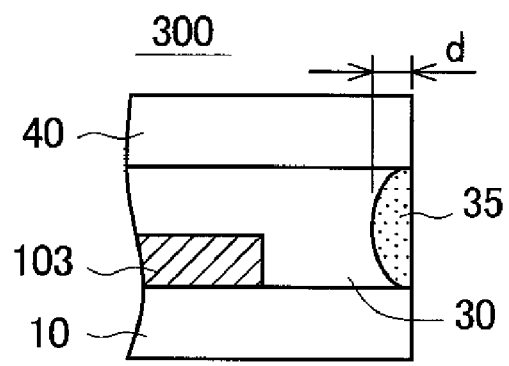
FIG. 4A to FIG. 4D are cross-sectional views of an edge portion of the organic EL display device of the invention.
Figure 4B:
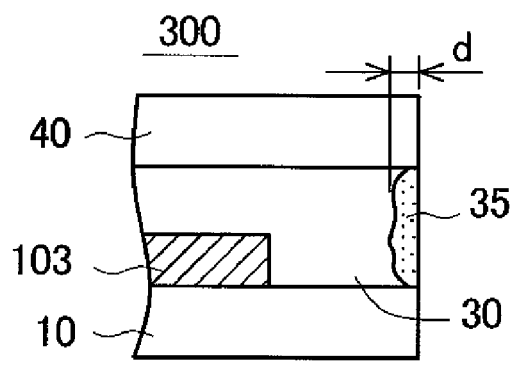

A shape of the degenerated portion 35 of the adhesive material sheet 30 also differs depending on a portion on which laser beams are focused. FIG. 4B is a cross-sectional view when laser beams are focused on an approximately center portion of the adhesive material sheet 30 in the film thickness direction. The degenerated portion 35 of the adhesive material sheet 30 is formed over the whole thickness thereof.

Figure 4C:
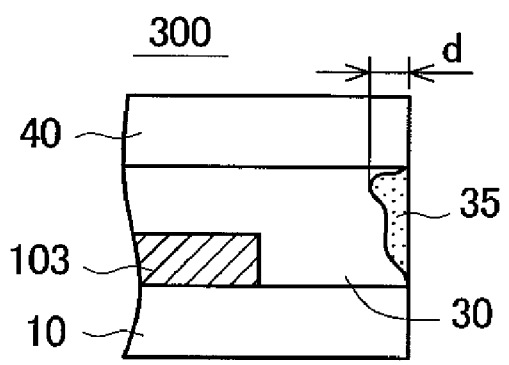
Figure 4D:
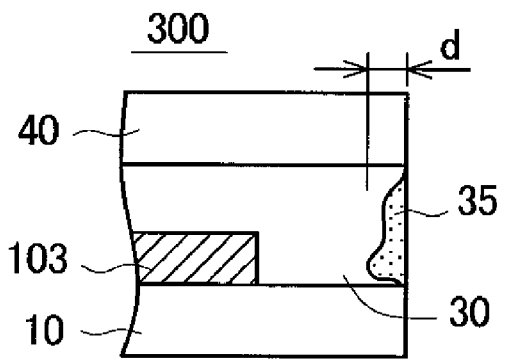
Figure 5A:
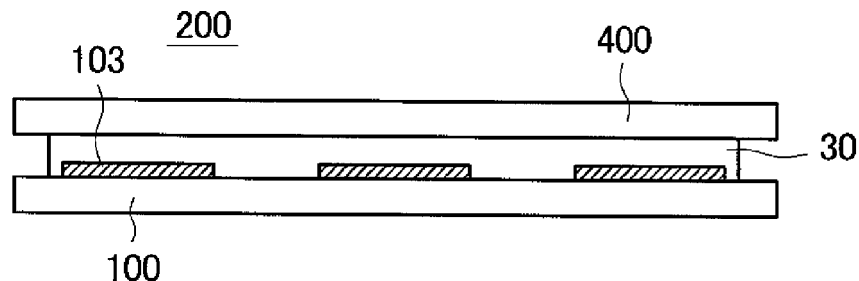
FIG. 5A to FIG. 5D are cross-sectional views of a conventional solid-sealing-type organic EL display device.
Figure 5B:
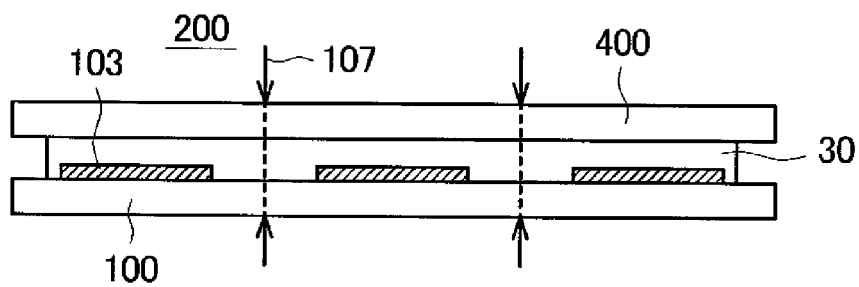
Figure 5C:
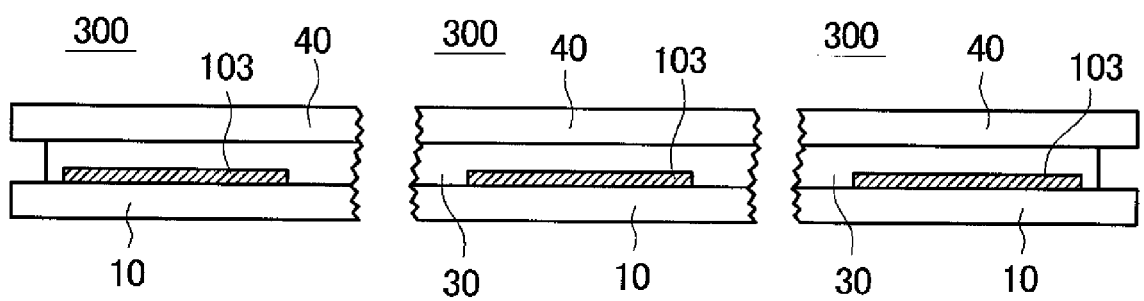
Figure 5D:
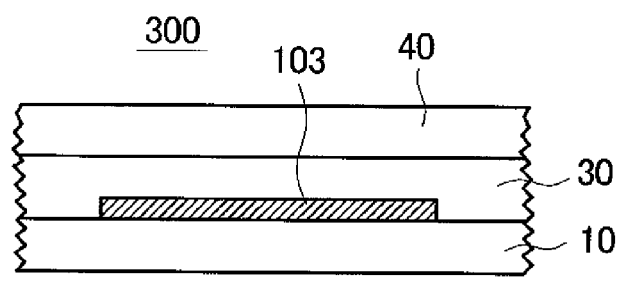

FIG. 4C is a cross-sectional view showing a state where laser beams are focused on a sealing-substrate-40 side of the adhesive material sheet 30 in the film thickness direction. In this case, a larger amount of the degenerated portion 35 of the adhesive material sheet 30 is formed on the sealing-substrate-40 side. FIG. 4D is a cross-sectional view showing a state where laser beams are focused on a element-substrate-10 side of the adhesive material sheet 30 in the film thickness direction. In this case, a larger amount of the degenerated portion 35 of the adhesive material sheet 30 is formed on the element-substrate-10 side. In FIG. 4A to FIG. 4D, a depth "d" of the degenerated portion 35 due to the radiation of laser beams is not less than 0.05 mm.

In this manner, a degenerated state of the edge portion of the adhesive material sheet 30 differs depending on the radiation condition of laser beams. Although the adhesive material sheet 30 in a usual state is transparent, the degenerated portion 35 which is formed due to the radiation of laser beams is carbonized in many cases and hence, the portion 35 is visible with naked eyes. Further, non-degenerated portions of the adhesive material sheet 30 have a normal adhesive strength and hence, a moisture prevention effect which the adhesive material sheet 30 possesses for protecting the organic EL element 103 is hardly influenced.

Embodiment 2

In the embodiment 1, the element substrate 10 and the sealing substrate 40 are adhered to each other using the adhesive material sheet 30, and the moisture prevention effect is imparted to the adhesive material sheet 30. However, in this embodiment, the adhesive material sheet 30 is not used as an adhesive material, and the adhesive material is directly printed on the mother sealing substrate 400 by coating. The formation of a coating film does not require accuracy and hence, for example, the coating film can be formed by screen printing.

As a material used as the adhesive material for printing, for example, an epoxy resin or an acrylic resin can be used. A film thickness of a printed film is set to 10 μm to 20 μm, for example. The film thickness of the printed film may be further decreased provided that the sufficient adhesion between the element substrate 10 and the sealing substrate 40 can be ensured.

After forming the adhesive material on the mother sealing substrate 400 by printing as described above, the mother sealing substrate 400 is prebaked at a temperature of approximately 80° C. so that the adhesive material 38 is half-cured. The semi-cured adhesive material 38 has some adhesiveness. Thereafter, the mother element substrate 100 and the mother sealing substrate 400 are adhered to each other using the semi-cured adhesive material thus manufacturing the mother panel 200. Thereafter, final baking is performed at a temperature of 100° C. for 2 hours or at a temperature of 120° C. for 30 minutes. Due to final baking, the element substrate 10 and the sealing substrate 40 are firmly adhered to each other, and it is also possible to impart a moisture proof effect to the adhesive material 38.

An adhesive agent which is formed by printing an epoxy resin, an acrylic resin or the like also has a mechanical strength and hence, when the mother panel is separated into the individual organic EL display panels 300, there may be a case where a glass edge surface becomes irregular at a scribing portion or peeling-off is generated between the adhesive agent and the glass substrate using such a scribing portion as a starting point.

Also when the adhesive material is formed by printing, as has been explained in conjunction with the embodiment 1, by radiating laser beams to portions of the adhesive material along the scribing lines, an adhesive strength of the adhesive material at the portions can be eliminated or weakened. Accordingly, it is possible to prevent the edge portion of glass from becoming irregular when the mother panel 200 is separated into the individual organic EL display panels 300. Further, the portions of the adhesive material to which laser beams are radiated are degenerated so that such portions become fragile whereby it is possible to easily break the portions of the adhesive material.

Here, the manufacturing steps of this embodiment are substantially equal to the manufacturing steps of the embodiment 1 explained in conjunction with FIG. 3 except that the adhesive material is formed on the mother sealing substrate 400 by printing in place of using the adhesive material sheet 30. The adhesive material which is formed by printing is also transparent in a usual state and hence, when portions of the adhesive material sheet are degenerated and carbonized due to the radiation of laser beams at the edge portions of the organic EL display panel, such degenerated portions are visible with naked eyes. Further, also when the adhesive material is formed by printing, a depth of the carbonized portion is not less than 0.05 mm from an edge portion of the organic EL display panel 300. Also in this case, portions of the adhesive material to which laser beams are not radiated have a normal adhesive strength and hence, a sealing effect that the adhesive material possess for sealing the organic EL display panel 300 is not influenced due to the radiation of laser beams.

Although the explanation has been made with respect to the case where the adhesive material is formed on the mother sealing substrate by screen printing in this embodiment, the formation method is not limited to printing, and the adhesive material may be formed by an inkjet printing method, a rod coating method or the like.

What is claimed is:

1. An organic EL display device having an organic EL display panel in which an element substrate on which organic EL elements are formed and a sealing substrate are adhered to each other by way of an adhesive material sheet, wherein
a portion of the adhesive material sheet at an edge surface of the organic EL display panel has an adhesive strength which is lower than an adhesive strength of other portions of the adhesive material sheet.

2. The organic EL display device according to claim 1, wherein a depth of the portion of the adhesive material sheet having the lower adhesive strength is not less than 0.05 mm from an edge portion of the element substrate or the sealing substrate.

3. The organic EL display device according to claim 1, wherein the portion of the adhesive material sheet having the lower adhesive strength is carbonized differently from said other portions of the adhesive material sheet.

4. An organic EL display device having an organic EL display panel where an element substrate on which organic EL elements are formed and a sealing substrate are adhered to each other by way of an adhesive material which covers the organic EL elements, wherein
a portion of the adhesive material at an edge surface of the organic EL display panel has an adhesive strength which is lower than an adhesive strength of other portions of the adhesive material.

5. An organic EL display device according to claim 4, wherein a depth of the portion of the adhesive material having the lower adhesive strength is not less than 0.05 mm from an edge portion of the element substrate or the sealing substrate.

6. An organic EL display device according to claim 4, wherein the portion of the adhesive material having the lower adhesive strength is carbonized differently from said other portions of the adhesive material.

7. An organic EL display device according to claim 4, wherein the adhesive material is formed by printing.

* * * * *